United States Patent
Albin et al.

(10) Patent No.: US 12,132,136 B2
(45) Date of Patent: Oct. 29, 2024

(54) CDSETE PHOTOVOLTAIC DEVICES WITH INTERDIGITATED BACK CONTACT ARCHITECTURE

(71) Applicants: Alliance for Sustainable Energy, LLC, Golden, CO (US); Bowling Green State University, Bowling Green, OH (US)

(72) Inventors: David Scott Albin, Denver, CO (US); Marco Nardone, Bowling Green, OH (US); Gregory Frank Pach, Denver, CO (US)

(73) Assignees: Alliance for Sustainable Energy, LLC, Golden, CO (US); Bowling Green State University, Bowling Green, OH (US)

( * ) Notice: Subject to any disclaimer, the term of this patent is extended or adjusted under 35 U.S.C. 154(b) by 390 days.

(21) Appl. No.: 17/599,851

(22) PCT Filed: Apr. 3, 2020

(86) PCT No.: PCT/US2020/026588
§ 371 (c)(1),
(2) Date: Sep. 29, 2021

(87) PCT Pub. No.: WO2020/242600
PCT Pub. Date: Dec. 3, 2020

(65) Prior Publication Data
US 2022/0190191 A1    Jun. 16, 2022

Related U.S. Application Data

(60) Provisional application No. 62/828,576, filed on Apr. 3, 2019.

(51) Int. Cl.
*H01L 31/18* (2006.01)
*H01L 31/073* (2012.01)

(52) U.S. Cl.
CPC ........ *H01L 31/1832* (2013.01); *H01L 31/073* (2013.01)

(58) Field of Classification Search
CPC .......................... H01L 31/1832; H01L 31/073
See application file for complete search history.

(56) References Cited

U.S. PATENT DOCUMENTS 4,296,188 A * 10/1981 Hodes ............... H01L 21/02628
429/111
8,900,891 B2   12/2014 Pawlak et al.
(Continued)

FOREIGN PATENT DOCUMENTS

WO    20170184777 A1    5/2017

OTHER PUBLICATIONS

Albin, D.S. et al., "Fil thickness and chemical processing effects on the stability of cadmium telluride solar cells," Elsevier Thin Solid Films, vol. 515, 2006, 10 pages.
(Continued)

*Primary Examiner* — Victor A Mandala
*Assistant Examiner* — Colleen E Snow
(74) *Attorney, Agent, or Firm* — Sam J. Barkley

(57) ABSTRACT

Disclosed herein are CdSeTe photovoltaic devices having interdigitated back contact architecture for use in polycrystalline thin films in photovoltaic devices.

18 Claims, 10 Drawing Sheets

(56) References Cited

U.S. PATENT DOCUMENTS

| | | |
|---|---|---|
| 9,425,326 B2 | 8/2016 | Kar et al. |
| 2009/0152664 A1 | 6/2009 | Klem et al. |
| 2013/0280854 A1 | 10/2013 | Jaseieniak et al. |
| 2015/0187969 A1 | 7/2015 | Moslehi et al. |
| 2016/0087321 A1 | 3/2016 | Wohrle et al. |
| 2016/0126395 A1 | 5/2016 | Damjanovic et al. |
| 2016/0164490 A1 | 6/2016 | Kamijo et al. |
| 2016/0380196 A1* | 12/2016 | Eisenberg ............... H01L 31/09 250/206 |
| 2017/0352775 A1 | 12/2017 | Hahn et al. |

OTHER PUBLICATIONS

Burst, J.M. et al., "CdTe solar cells with open-circuit voltage breaking the 1V barrier," Nature Energy, vol. 1, Mar. 2016, 8 pages.

Kephart, J. et al., "Sputter-Deposited Oxides for Interface Passivation of CdTe Photovoltaics," IEEE Journal of Photovoltaics, vol. 8, No. 2, Mar. 2018, 7 pages.

Masuko, K. et al., "Achievement of More Than 25% Conversion Efficiency With Crystalline Silicon Heterojunction Solar Cell," IEEE Journal of Photovoltaics, vol. 4, No. 6, Nov. 2014, 3 pages.

Nardone, M., "All-back-Schottky-contact thin-film photovoltaics," Journal of Applied Physics, vol. 119, 2016, 8 pages.

Sellin, P.J. et al., "Drift Mobility and Mobility-Lifetime Products in CdTe:Cl Grown by the Travelling Heater Method," IEEE Transactions on Nuclear Science, vol. 52, No. 6, Dec. 2005, 5 pages.

Zaunbrecher, K.N. et al., "Impact of extended defects on recombination in CdTe heterostructures grown by molecular beam epitaxy," Applied Physics Letters, vol. 109, 2016, 4 pages.

Zhao, X-H. et al., "Ultralow Interface Recombination Velocity (~ 1 cm/S) at CdTe/MgxCd1-x Te Heterointerface," IEEE Journal of Photovoltaics, vol. 7, No. 3, May 2017, 6 pages.

Zhong, Z. et al., "Tuning the work function in transition metal oxides and their heterostructures," Physical Review B 93, 2016, 9 pages.

International Search Report and Written Opinion from corresponding PCT patent application No. PCT/US20/26588, mail date Feb. 10, 2021, 10 pages.

* cited by examiner

CDSETE PHOTOVOLTAIC DEVICES WITH INTERDIGITATED BACK CONTACT ARCHITECTURE

CROSS-REFERENCE TO RELATED APPLICATION

This application claims priority under 35 U.S.C. § 371 to PCT Patent Application No. PCT/US2020/026588 filed on 3 Apr. 2020, which application claims priority to U.S. Patent Application No. 62/828,576 filed on 3 Apr. 2019, the contents of which are hereby incorporated in their entirety.

CONTRACTUAL ORIGIN

The United States Government has rights in this invention under Contract No. DE-AC36-08GO28308 between the United States Department of Energy and Alliance for Sustainable Energy, LLC, the Manager and Operator of the National Renewable Energy Laboratory.

BACKGROUND

Polycrystalline, thin-film CdTe photovoltaic modules have shown tremendous efficiency, cost, and reliability gains during the last 5 years. It is now the leading thin-film material with a record cell efficiency of 22.1%, module efficiency of 18.6%, costs approaching $0.40/W, and a historically (13+ years) low annual degradation rate of about 0.25%. Like all polycrystalline thin-film cells, non-radiative recombination associated with defects at grain boundaries and interfaces limits open-circuit voltage (Voc), in this case, to approximately 70% the Schockley-Queisser value. Minority carrier lifetime, measured by techniques like time-resolved photoluminescence (TRPL), is most often used to measure recombination. Longer TRPL lifetimes are synonymous with reduced non-radiative recombination and make superior photovoltaic devices and modules.

Though requiring growth techniques and structures not applicable to low-cost, large-area module fabrication, recent laboratory results achieved to date with CdTe and CdSeTe have been impressive and indicate significant improvements in polycrystalline thin film modules. For example, molecular beam epitaxy grown, single-crystal (sx) double heterostructures (DHs) using lattice-matched Cd(Mg,Te) have attained lifetimes ($\tau$) greater than 1 s. In addition, a sx-CdTe device with high P-doping recently demonstrated a new world record open-circuit voltage (Voc) greater than 1 volt. More recently, alumina has been shown to effectively passivate polycrystalline CdSeTe films significantly improving carrier lifetime in structures using this encapsulating layer. However, the presence of even very thin high resistivity alumina (or higher bandgap layers in a true DH) is a formidable barrier to charge collection in traditional p-n structures.

SUMMARY

Exemplary embodiments of the invention disclosed herein provide devices and methods that will circumvent this by using an entirely new device architecture. Disclosed herein are high-efficiency CdTe and Cd(Se,Te) absorber devices using an interdigitated back contact (IBC) architecture that permits the use of alumina as a passivation layer. Higher lifetimes permit this IBC architecture with practical and cost-effective back contact geometries of from about 10 to about 100 microns. The built-in electric field generated by two different work function metals or carrier-selective metal oxides are used to collect photo-generated carriers. This yields immediate cost savings and improved reliability through fewer component layers, reduced processing, and inherently more robust structures. Finally, the devices disclosed herein will perform better with highly compensated (i.e., low carrier density) absorbers that result from the $CdCl_2$ treatments used to promote grain growth and minimize recombination.

In an aspect, disclosed herein is a method for making a polycrystalline CdSeTe device comprising an interdigitated back contact architecture. In an embodiment, the CdSeTe device comprises a CdSeTe film. In an embodiment, the CdSeTe device exhibits a minority carrier lifetime of at least 100 ns. In an embodiment, the CdSeTe device exhibits a lateral diffusion length of at least 5 µm. In an embodiment, the CdSeTe device exhibits a minority carrier lifetime of at least 100 ns and a lateral diffusion length of at least 5 µm.

In an aspect, disclosed herein is a method for making a polycrystalline CdSeTe device comprising an interdigitated back contact architecture wherein the method comprises a first step of a deposition of a first metal layer to a thickness of from about 100 to about 500 nm onto a substrate; and a second step of a deposition of an electrically insulating layer onto a metal/metal oxide layer; and a third step of a deposition of a 100 nm to 500 nm metal contact layer; and a fourth step of cutting through a top metal/metal oxide and insulating layers to expose a bottom metal/metal oxide layer. In an embodiment, the CdSeTe device comprises a CdSeTe film. In an embodiment, the CdSeTe device exhibits a minority carrier lifetime of at least 100 ns. In an embodiment, the CdSeTe device exhibits a lateral diffusion length of at least 5 µm. In an embodiment, the CdSeTe device exhibits a minority carrier lifetime of at least 100 ns and a lateral diffusion length of at least 5 µm.

In an aspect, disclosed herein is a method for making a polycrystalline CdSeTe device comprising an interdigitated back contact architecture wherein the method comprises, a first step of a vacuum deposition of $Cd(Se_xTe_{1-x})$ onto an interdigitated back contact structure heated to about 450° C.; and a second step of annealing the interdigitated back contact and $Cd(Se_xTe_{1-x})$ structure at 500-600° C. while suspended over a powder comprising $Cd(Se_xTe_{1-x})$ wherein x is from zero to 0.4; and a third step of annealing the interdigitated back contact and $Cd(Se_xTe_{1-x})$ structure at from about 450 to about 525° C. while suspended over a $CdCl_2$ containing powder in an inert gas atmosphere for about 10 to 20 minutes; and a fourth step of coating the interdigitated back contact and $Cd(Se_xTe_{1-x})$ structure with a transparent passivation $Al_2O_3$ layer of from about 20 nm to about 100 nm thickness; and a fifth step of treating the resulting device structure to a $CdCl_2$ anneal at a temperature of between about 400 and about 450° C. In an embodiment, the fifth step of treating the resulting device structure to a $CdCl_2$ anneal at a temperature of between about 400 and about 450° C. occurs in an atmosphere containing oxygen. In an embodiment, the fifth step of treating the resulting device structure to a $CdCl_2$ anneal at a temperature of between about 400 and about 450° C. occurs in an atmosphere lacking oxygen. In another embodiment, the second step of annealing the interdigitated back contact and $Cd(Se_xTe_{1-x})$ structure at 500-600° C. while suspended over a powder comprising $Cd(Se_xTe_{1-x})$ wherein x is from zero to 0.4 results in an increase in the density of the $Cd(Se_xTe_{1-x})$. In an embodiment, the CdSeTe device further comprises a CdSeTe film. In an embodiment, the CdSeTe device exhibits a minority carrier lifetime of at least 100 ns and a lateral diffusion length of at least 5 µm.

In an aspect, disclosed herein is a method for making a polycrystalline CdSeTe device comprising an interdigitated back contact architecture wherein the method comprises a first step of a non-vacuum deposition of colloidal nanocrystalline $Cd(Se_xTe_{1-x})$ onto an interdigitated back contact structure. In an embodiment, the interdigitated back contact structure is made by a method comprising a first step of depositing colloidal $Cd(Se_xTe_{1-x})$ nanocrystals through layer-by-layer spincoating on interdigitated back contact substrates; and a second step of drying $Cd(Se_xTe_{1-x})$ films at about 150° C.; and a third step of dipping the interdigitated back contact and $Cd(Se_xTe_{1-x})$ structure in a saturated solution of $CdCl_2$ in methanol and rinsing with isopropanol; and a fourth step of sintering nanocrystalline films through thermal annealing at about 350° C. for about 20 to about 30 seconds; and repeating the first step, the second step, the third step and the fourth step until the deposited layer is from about 1 μm to about 2 μm; and a final step of coating the interdigitated back contact and $Cd(Se_xTe_{1-x})$ structure with a transparent passivation $Al_2O_3$ layer of from about 20 nm to about 100 nm thickness. In an embodiment, the first step of depositing colloidal $Cd(Se_xTe_{1-x})$ nanocrystals is through layer-by-layer bladecoating on interdigitated back contact substrates. In an embodiment, the CdSeTe device further comprises a CdSeTe film and wherein the CdSeTe device exhibits a minority carrier lifetime of at least 100 ns and a lateral diffusion length of at least 5 μm.

Other objects, advantages, and novel features of the present invention will become apparent from the following detailed description of the invention when considered in conjunction with the accompanying drawings.

In an embodiment, diffusion lengths of La of 10 μm were measured in devices disclosed herein.

Figure 10:
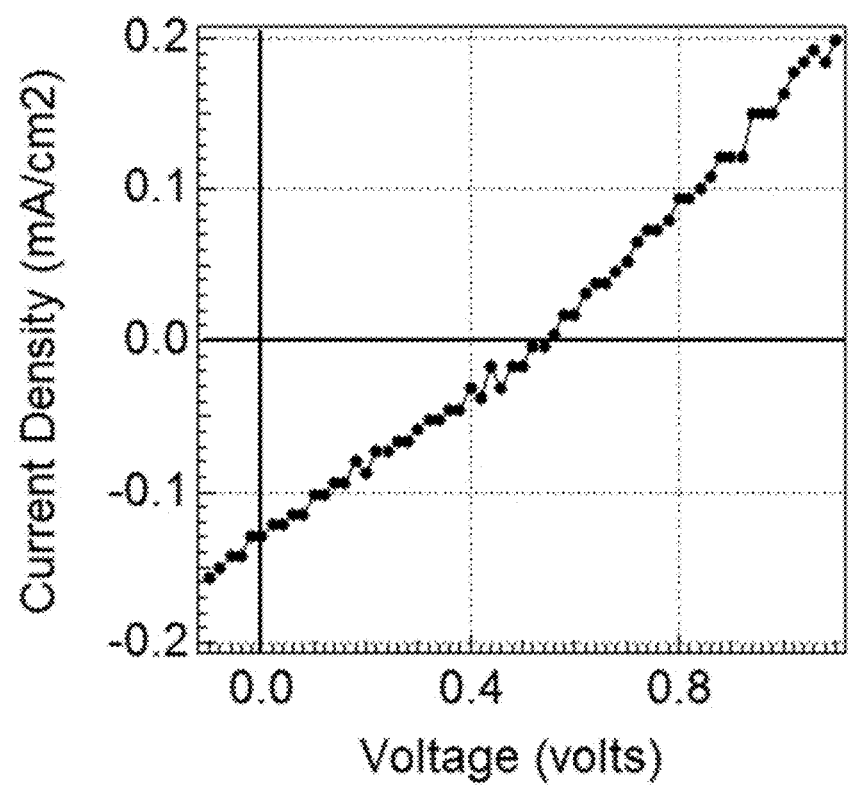

FIG. 10 depicts a measured J-V curve of a non-optimized nanocrystalline LBC device having $V_{oc}$=0.54 volts, $J_{sc}$=0.143 mA/cm², and FF=27.5%.

DETAILED DESCRIPTION

Figure 1:
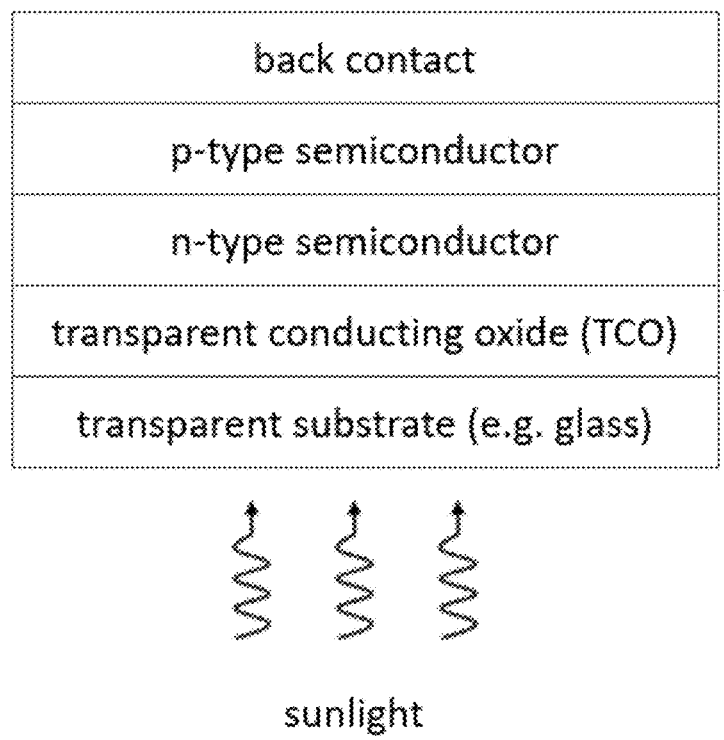
FIG. 1 depicts a superstrate design of an embodiment of a device disclosed herein.
Figure 2:
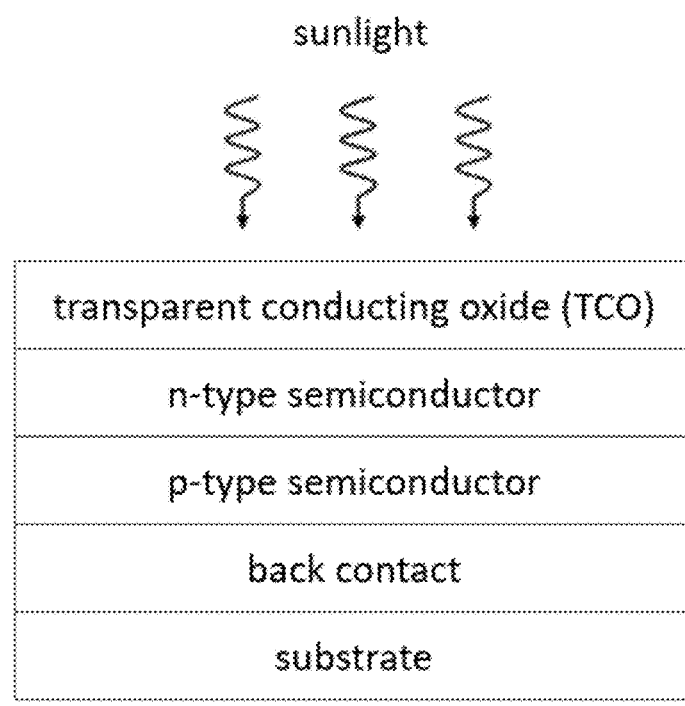
FIG. 2 depicts a substrate design of an embodiment of a device disclosed herein.

Disclosed herein are CdSeTe photovoltaic devices with IBC architecture as a novel approach for using polycrystalline thin films in photovoltaic solar cell devices. To date, all viable thin film devices based on polycrystalline thin films have used a heterojunction structure based upon the use of a front contact, transparent conducting oxide (TCO), a n-type semiconductor (n-SC), a p-type semiconductor (p-SC), and an appropriate back contact (BC) which may or may not be transparent. In this structure, the usual arrangement of layers is TCO/n-SC/p-SC/BC. If the TCO is deposited onto a supporting transparent substrate (e.g. glass), the corresponding structure, glass/TCO/n-SC/p-SC/BC is referred to as a superstrate geometry in which sunlight is incident on the glass side (see FIG. 1). In contrast, if the BC is deposited onto a supporting substrate (which need not be transparent) the corresponding structure, glass/BC/p-SC/n-SC/TCO is referred to as a substrate geometry in which sunlight is incident on the TCO directly (see FIG. 2). A key advantage of the substrate geometry is that opaque, flexible, lightweight substrates amenable to high throughput process (e.g. roll-to-roll) can be used. In both designs, the n-SC (and often TCO) typically is made as thin as possible to reduce absorption by those layers so that maximum absorption occurs in the p-SC. The latter layer serves as the primary absorption layer where solar photons (solar irradiance) are converted to electron-hole pairs. In both designs, the physical contact of the n-SC and p-SC induces an electric field that effectively separates electrons from holes resulting in the flow of current and the generation of power. In conventional superstrate and substrate geometries, this current flow is primarily perpendicular to the layers comprising the device and thus, no layer in the device stack can be an electrical insulator such as alumina.

Figures 3A, 3B:
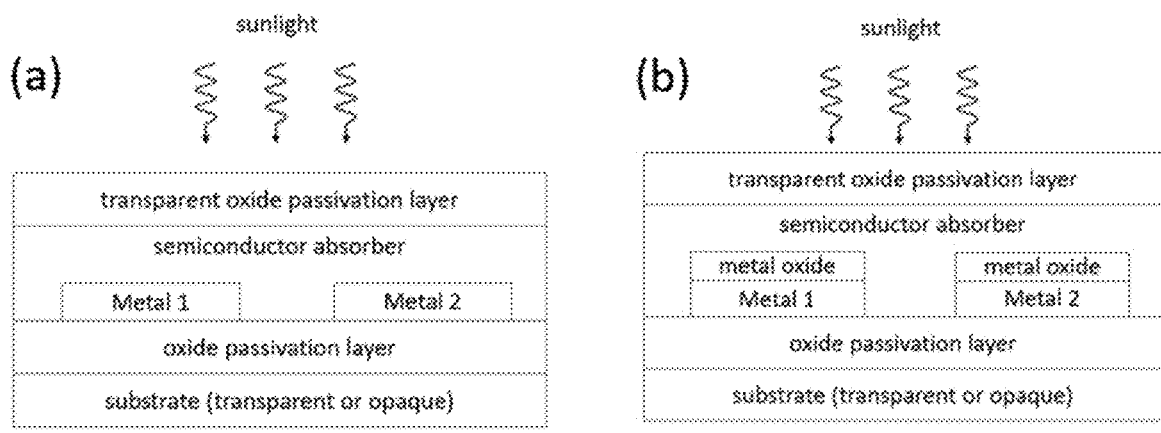
FIG. 3a depicts an embodiment of IBC architecture used in devices disclosed herein with metal/s.c. junctions.
FIG. 3b depicts an embodiment of IBC architecture used in devices disclosed herein with a metal/metal-oxide/s.c. junction.
Figures 4A, 4B:
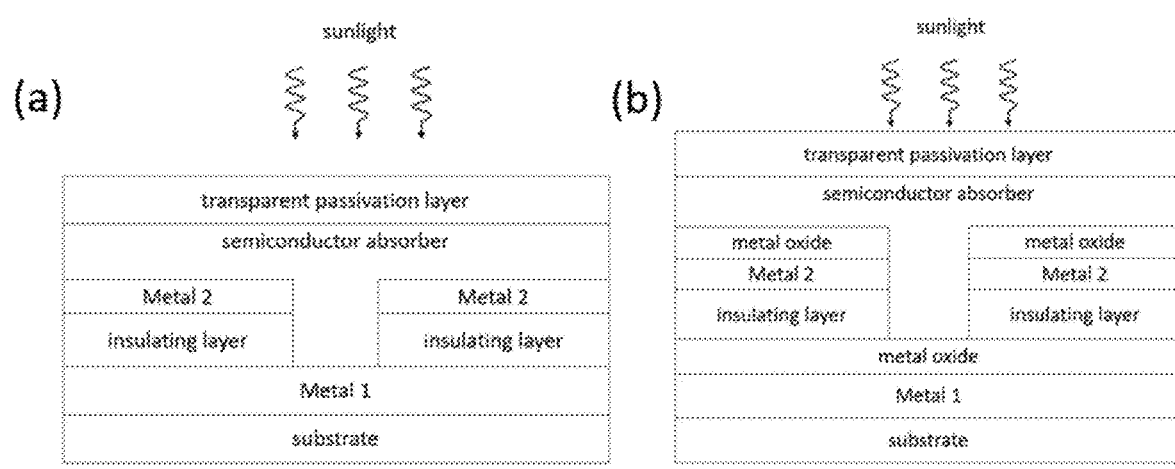
FIG. 4a depicts an embodiment of a quasi-interdigitated back contact (QIBC) architecture of devices disclosed herein with a metal/s.c. junction wherein the metals can be interchanged.
FIG. 4b depicts an embodiment of a quasi-interdigitated back contact (QIBC) architecture of devices disclosed herein with a metal/metal-oxide/s.c. junction wherein the metal/metal-oxides can be interchanged.

In the IBC architecture, as disclosed in embodiments herein, the electric field used to separate electrons and holes generated by absorption in a semiconductor is induced by placing the semiconductor between two different metals. One metal (arbitrarily labeled as metal 1) is a low work function metal while the other (arbitrarily labeled as metal 2) is a high work function metal. These metals are hypothetically placed coplanar, in an interdigitated pattern onto a substrate upon which the semiconductor is next deposited (see FIG. 3). Since the substrate need not be transparent, this is a substrate geometry. In an embodiment, the metal spacing is on the order of 5 to 15 microns depending on the transport properties of the semiconductor. The electric field can be established by: (i) the work function difference between metal 1 and 2, (ii) a Schottky junction between the metals and semiconductor, or (iii) p-n junctions created by an n-SC layer on the low work function metal and a p+−SC (higher p-type doping) on the high work function metal (certain oxides can act as semiconductors when sufficiently doped). In the latter case, the metals serve as ohmic contacts. The electric field generated at the back of the device extends between metal 1 and metal 2 and upwards into the semiconductor. Unlike conventional substrate geometries, current flow in devices disclosed herein is now lateral within the layer structure and permits the use of non-conducting, oxide passivation layers for encapsulating the structure as depicted in FIG. 3 and FIG. 4. For example, aluminum oxide ($Al_2O_3$) is a strong passivation layer for semiconductor alloys made from Cd, Se, and Te (i.e., Cd(Se,Te) alloys). A sandwich or double-heterojunction (DH) structure consisting of $Al_2O_3$/Cd(Se,Te)/$Al_2O_3$ has been previously shown as having significantly reduced non-radiative recombination at the alumina and semiconductor layer interfaces. Combined with reduced non-radiative recombination in the bulk of the Cd(Se,Te), collection of photo-generated electrons and holes would be significantly increased resulting in higher efficiency solar cells. It should be noted that high performance in solar cells require both low interface (i.e., regions where dissimilar materials join) and bulk (i.e., regions within a given material) non-radiative recombination. Since $Al_2O_3$ is electrically insulating, this material cannot be used in conventional superstrate or substrate designs since current must traverse these layers. However, in the IBC architecture, electrically insulating layers using $Al_2O_3$ can be used to encapsulate a material like Cd(Se,Te) since current flow is parallel to these layers and need not traverse them.

FIG. 3 depicts two embodiments of the IBC approach. In the left figure, the metal contacts are established by physical contact of the two different metals directly with the semiconductor Cd(Se,Te); this forms a Schottky junction. In the right figure, a thin oxide tunneling barrier is deposited onto the two different metals before the Cd(Se,Te) is deposited, which has been shown to enhance Schottky junctions. In the case of the low work function metal 1, the oxide is an electron-selective contact that aids electron collection from the Cd(Se,Te). In the case of the high work metal 2, the oxide is a hole-selective contact that aids hole collection from the Cd(Se,Te). If the oxide layers are made excessively n-type (on metal 1) and p-type (on metal 2), p-n junctions will result between the oxides and the Cd(Se,Te). In addition to providing better performance, the oxides also protect the metal layers during post processing involving the deposition of the Cd(Se,Te) as well as grain-growth annealing techniques involving exposure of the Cd(Se,Te) to subsequent high temperature $CdCl_2$ vapor fluxes.

FIG. 4 depicts a modified version of the IBC architecture in which one metal (shown as metal 1) is deposited over the entire substrate while the other metal (metal 2) maintains electrical isolation with the help of an insulating layer. Note that the metals can be interchanged, i.e., metal 2 can be deposited first with metal 1 electrically isolated with the use of an insulating layer. This quasi-IBC (QIBC) approach represents a more manufacturable method to implement an IBC design. In an embodiment, a manufacturable method would consist of the following steps: 1) coat substrate with metal 1, 2) coat substrate with an insulating layer, 3) coat substrate with metal 2, 4) make grooves (laser, mechanical scribing, or lithography process) through metal 2 and insulating layer, and finally 5) deposit Cd(Se,Te).

Figure 5:
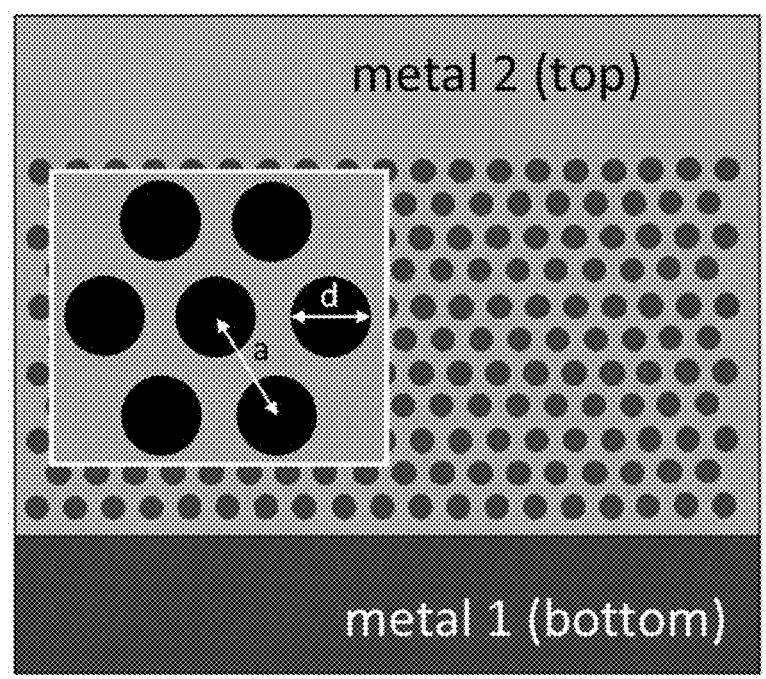
FIG. 5 depicts an embodiment of a LBC structure wherein the metals can be interchanged. Dimensions "a" and "d" correspond to contact "pitch" and "diameter", respectively.

In an embodiment, both the IBC and the QIBC structures involve long metal fingers (or combs). Without being bound by theory, breakage of fingers would likely reduce current collection and fabrication problems may arise due to mechanical stress. FIG. 5 depicts a lattice back contact (LBC) architecture that avoids the use of long metal fingers by using a lattice array of circular openings to provide current pathways between metals 1 and 2. Similar to embodiments of the QIBC structure, in an embodiment of the LBC structure, the metals can be interchangeable with one another. The LBC structure is otherwise identical to the QIBC structure in terms of the manufacturing method.

Figure 6:
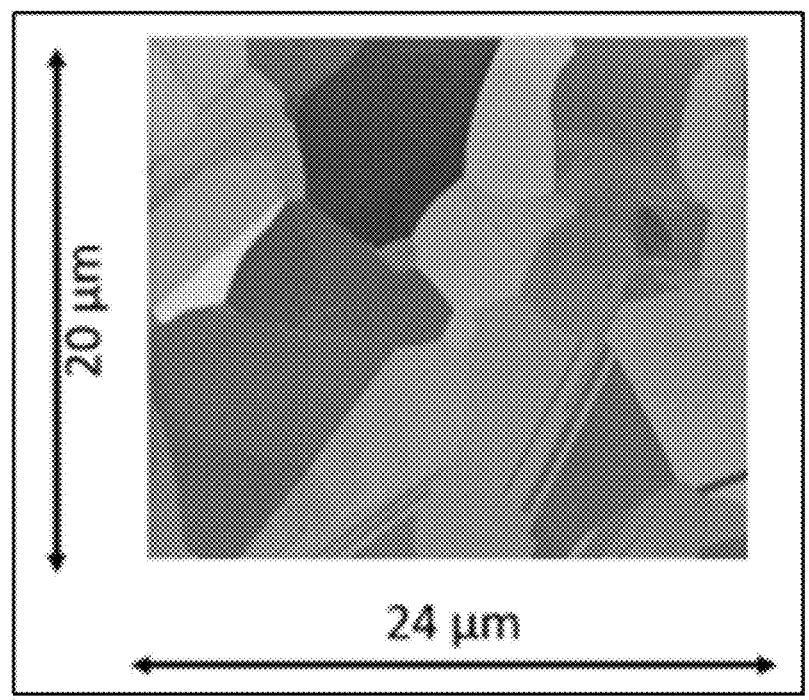
FIG. 6 depicts an electron-beam backscatter diffraction (EBSD) image that shows the large-grain morphology of a Cd(Se,Te) film after a high temperature $CdCl_2$ step.
Figure 7:
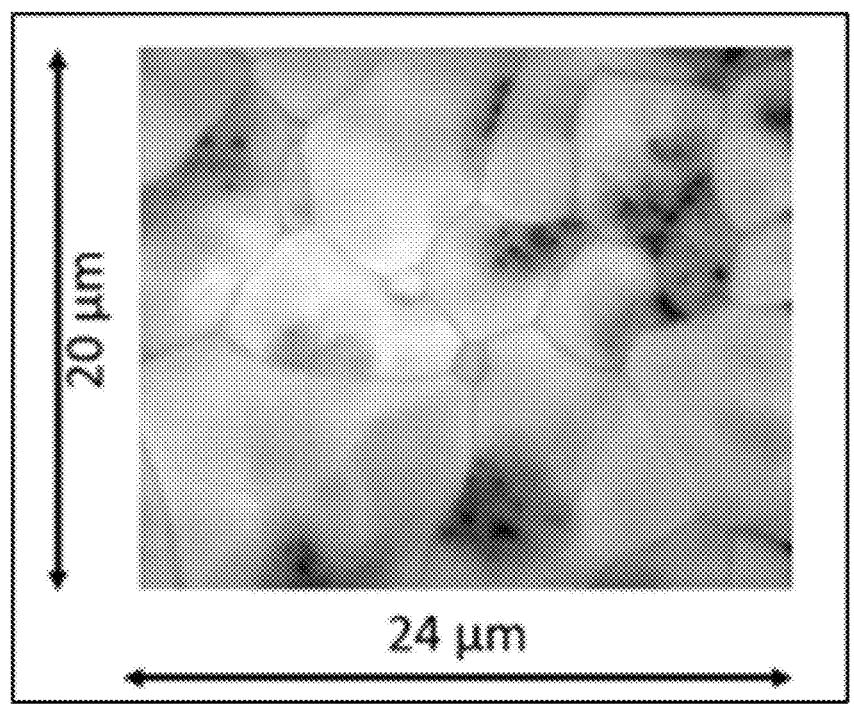
FIG. 7 depicts cathodoluminescence (CL) of a large-grain Cd(Se,Te) film showing high radiative recombination (low non-radiative recombination) in bulk and at grain boundaries.

In the IBC, QIBC, and LBC architectures, the need for lateral current flow implies high lateral electron and hole diffusion lengths for the absorbing semiconductor. In embodiments disclosed herein, the use of $Al_2O_3$ as the top passivation layer and Cd(Se,Te) as the absorbing semiconductor represents an architecture with significantly reduced non-radiative interface recombination. In an embodiment, the Cd(Se,Te) layer can be deposited by vacuum deposition techniques (e.g., common evaporation, vapor transport deposition) and non-vacuum nanocrystalline thin film processes. In vacuum deposition techniques, it is common to decrease bulk non-radiative recombination, by exposing the Cd(Se,Te) layer to a high-temperature (475-525° C.) $CdCl_2$ treatment in non-oxidizing ambient immediately after this layer is deposited on the IBC, QIBC, or LBC structure. A post-Cd(Se,Te) anneal in a Se-containing ambient may precede the $CdCl_2$ step in order to increase film adhesion, and thus, allow higher $CdCl_2$ annealing temperatures. Higher temperature $CdCl_2$ treatments also increase the grain size of evaporated Cd(Se,Te) films as shown by the electron-beam backscatter diffraction (EBSD) image in FIG. 6. The morphology is shown to be dense (low porosity), and consisting of Cd(Se,Te) grains of approximately 5-10 micron size. When combined with IBC and QIBC metal spacings of nominally 5 microns, lateral transport across grain boundaries is thus minimized. This morphology is also shown to have low bulk non-radiative recombination by high-resolution cathodoluminescence (CL) imaging shown in FIG. 7. The low-contrast between the bulk grain interior and grain boundaries indicates that the $CdCl_2$ treatment effectively passivates grain boundaries, significantly reducing non-radiative recombination in the Cd(Se,Te) bulk. The net result for this structure is a high carrier lifetime and adequate lateral diffusion length. In non-vacuum, nanocrystalline film deposition, colloidal Cd(Se,Te) is suspended in a mixture of pyridine and 1-propanol at 40 mg/mL. These suspensions are deposited on IBC, QIBC, or LBC structures via spin-coating or bladecoating in a layer-by-layer process. Following each layer deposition, substrates are placed on a hotplate at 150° C. for 2-5 minutes to evolve excess solvent. Substrates are allowed to cool to room temperature before being dipped into a saturated solution of $CdCl_2$ in methanol for 20-30 seconds. During this step, chlorine binds to the nanocrystal surface. Upon removal from the methanol solution, films are immediately rinsed with isopropanol and dried under a flow of $N_2$. Nanocrystalline films are then sintered via a 20-30 second anneal on a hotplate at 350° C. During the sintering step, the crystalline phase of the Cd(Se,Te) is seen to change from wurtzite to zincblende. Additionally, chlorine becomes mobile in the film during the sintering process and helps passivate undercoordinated surfaces by preferentially segregating to grain boundaries. Each deposited Cd(Se,Te) layer is typically 50-100 nm and therefore the process is repeated until the desired film thickness has been reached (typically 1-2 microns). The Cd(Se,Te) film may then be exposed to subsequent post-deposition treatments such as a final high temperature $CdCl_2$ treatment or Se anneal as described above.

Figure 8:
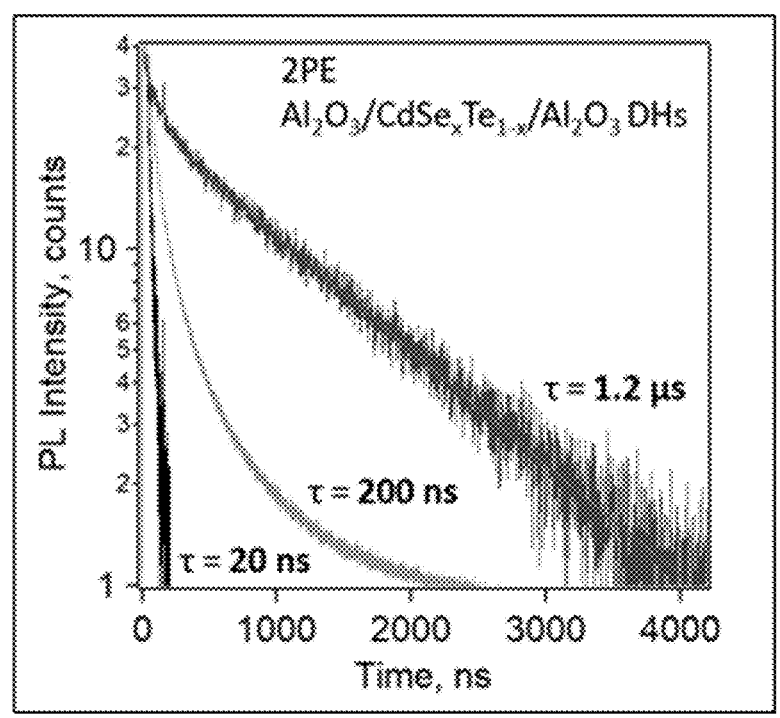
FIG. 8 depicts an embodiment of high carrier lifetime in devices disclosed herein as demonstrated by long time-resolved photoluminescence (TRPL) decay.

FIG. 8 depicts the time-resolved photoluminescence (TRPL) decay measured in an embodiment of a device made by using to the methods and IBC architectures disclosed herein. As is depicted in FIG. 8, the lifetime measured (about 1.2 µs) is the highest value reported to date for a polycrystalline device structure. Assuming a reported bulk minority carrier mobility of 100 $cm^2$/V*s, this corresponds to a potential diffusion length of greater than 15 microns. Once the Cd(Se,Te) layer is treated to the high-temperature $CdCl_2$ process which both increases grain size to a level comparable with the IBC metal spacing geometry and reduces bulk and grain boundary non-radiative recombination, the structure is capped with an optically transparent and electronically passivating $Al_2O_3$ layer.

Figure 9:
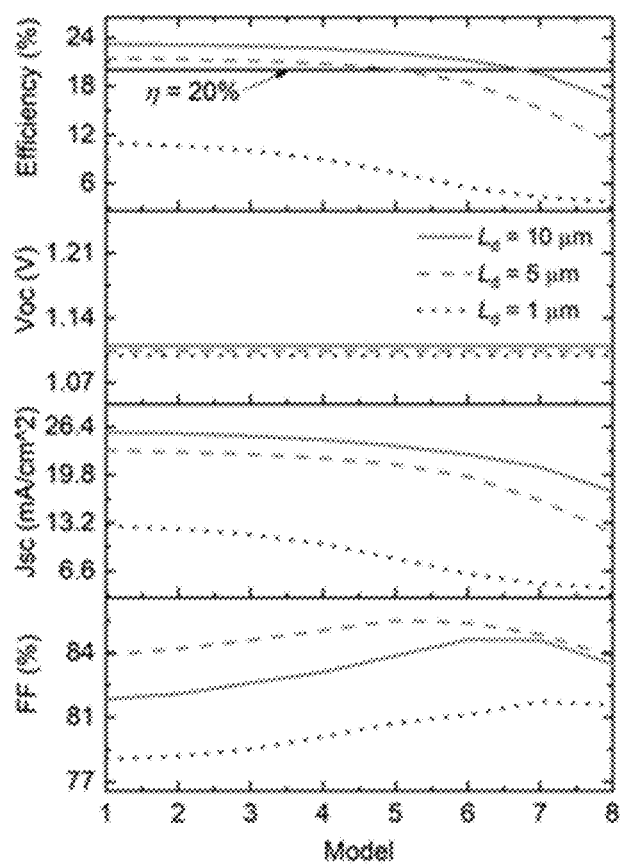
FIG. 9 depicts efficiency, open-circuit voltage (Voc), short-circuit current density (Jsc) and fill-factor (FF) as a function of device contact geometry pitch (a) and diameter (d) for three different minority carrier diffusion lengths (Ld).

FIG. 9 depicts the results of simulations for devices and architectures disclosed herein based on the effective surface passivation by $Al_2O_3$ and realistically long diffusion lengths discussed above. The results are presented in terms of power conversion efficiency, open-circuit voltage (Voc), short-circuit current density (Jsc), and FF as a function of different device contact geometries where it is shown that a realistic diffusion length of 10 microns theoretically supports 20% devices with contact diameters and pitches as large as 64 and 128 microns respectively. These geometries are well-within the laser-scribing capabilities.

FIG. 10 depicts the current-density vs. voltage (JV) scan of a non-optimized LBC device using a nanocrystalline thin film with measure values of $V_{oc}$ equal to 0.54 volts, $J_{sc}$ equal to 0.143 mA/cm2, and FF equal to 27.5%.

In an embodiment, a fabrication method for the QIBC and LBC structures is as follows: first, deposit onto an appropriate substrate, the first metal layer to a nominal thickness of 100-500 nm. This can either be the low work function metal 1, or the high work function metal 2. The substrate can either be rigid (e.g. glass) or a lightweight, flexible substrate (e.g. metal foil). This metal may or may not be subsequently coated with a thin, carrier-selective oxide. This oxide may or may not result from annealing of the metal in a controlled oxidizing environment; and second, deposit onto the metal/metal oxide layer a thin, electrically insulating layer that provides electrical isolation between this contact layer and the subsequent contact layer. For example, this layer would be 100 nm of $Al_2O_3$; and third deposit a remaining metal contact layer of nominal thickness 100-500 nm. If the layer described in (1) is a low work function metal, then this metal would be a high work function metal. If the layer described in (1) is a high work function metal, then this metal would be a low work function metal. This metal may or may not be subsequently coated with a thin (nominal thickness 2-10 nm), carrier-selective oxide. This oxide may or may not result from annealing of the metal in a controlled oxidizing environment; and fourth cut through the top metal/metal oxide and insulating layers in order to expose the bottom metal/metal oxide layer. This can be done by either lithography, laser, or mechanical scribing.

In an embodiment, representative low work function metals and electron-selective oxides include (but are not limited to) Ti, Cr, Zn, TiOx, and ZnO. In an embodiment, representative high work function metals and hole-selective oxides include (but are not limited to) Au, Ni, Pd, Pt, Mo, NiOx, MoOx.

In an embodiment, methods for the deposition of the $Cd(Se_xTe_{1-x})$ semiconductor absorber layer onto the IBC structure are disclosed herein. In an embodiment, the composition parameter x is 0.45 such that the film composition is $CdSe_{0.45}Te_{0.55}$. In certain embodiments, the composition parameter x can vary from 0.0 to 0.5 as in $CdSe_xTe_{1-x}$. In an embodiment, using evaporation, the composition parameter x is 0.2 such that the film composition is $CdSe_{0.2}Te_{0.8}$. In certain embodiments, the composition parameter x can vary from 0.1 to 0.3. In an embodiment, the method includes the following steps: first, $Cd(Se_xTe_{1-x})$ is deposited onto an IBC structure heated to a temperature at about 450° C.; and second, the $IBC+Cd(Se_xTe_{1-x})$ structure may or may not be annealed at 500-600° C. suspended over a Se-containing powder to help densify the $Cd(Se_xTe_{1-x})$ film; and third, the $IBC+Cd(Se_xTe_{1-x})$ structure is then annealed at 475-525° C. suspended over a $CdCl_2$ containing powder in inert gas ($N_2$, He, Ar) for 10-20 minutes to promote grain growth and minimize interface and bulk non-radiative recombination; and fourth, the $IBC+Cd(Se_xTe_{1-x})$ structure is then coated with a final, transparent passivation $Al_2O_3$ layer of nominal 20-100 nm thickness; and the final device structure may or may not be treated to a final $CdCl_2$ anneal at a lower temperature of 400-450° C. with or without oxygen present.

In an embodiment, using non-vacuum techniques, the method depositing the CdSeTe includes the following steps: first, a colloidal Cd(Se,Te) mixture is spincoated or blade-coated onto an IBC structure using a layer-by-layer process. The latter involves depositing sequential layers of 50-100 nm of film where anneals are used between layers to remove excess solvent, introduce $CdCl_2$, and to aid in film sintering. These anneals promote a wurtzite to zincblende transformation of the Cd(Se,Te) structure and allow $CdCl_2$ to passivate individual grains in the sintered film. The sequential deposition process is continued until a final film thickness of 1-2 microns is achieved.

The foregoing disclosure has been set forth merely to illustrate the invention and is not intended to be limiting.

We claim:

1. A method for making a polycrystalline CdSeTe device comprising an interdigitated back contact architecture wherein the CdSeTe device comprises a CdSeTe film and wherein the CdSeTe device exhibits a minority carrier lifetime of at least 100 ns.

2. The method of claim 1 wherein the CdSeTe device exhibits a lateral diffusion length of at least 5 μm.

3. The method of claim 1 wherein the CdSeTe device exhibits a minority carrier lifetime of at least 100 ns and a lateral diffusion length of at least 5 μm.

4. A method for making a polycrystalline CdSeTe device comprising an interdigitated back contact architecture wherein the method comprises a first step of a deposition of a first metal layer to a thickness of from about 100 to about 500 nm onto a substrate; and a second step of a deposition of an electrically insulating layer onto a metal/metal oxide layer; and a third step of a deposition of a 100 nm to 500 nm metal contact layer; and a fourth step of cutting through a top metal/metal oxide and insulating layers to expose a bottom metal/metal oxide layer.

5. The method of claim 4 wherein the CdSeTe device comprises a CdSeTe film.

6. The method of claim 5 wherein the CdSeTe device exhibits a minority carrier lifetime of at least 100 ns.

7. The method of claim 5 wherein the CdSeTe device exhibits a lateral diffusion length of at least 5 μm.

8. The method of claim 5 wherein the CdSeTe device exhibits a minority carrier lifetime of at least 100 ns and a lateral diffusion length of at least 5 μm.

9. A method for making a polycrystalline CdSeTe device comprising an interdigitated back contact architecture wherein the method comprises, a first step of a vacuum deposition of $Cd(Se_xTe_{1-x})$ onto an interdigitated back contact structure heated to about 450° C.; and a second step of annealing the interdigitated back contact and $Cd(Se_xTe_{1-x})$ structure at 500-600° ° C. while suspended over a powder comprising $Cd(Se_xTe_{1-x})$ wherein x is from zero to 0.4; and a third step of annealing the interdigitated back contact and $Cd(Se_xTe_{1-x})$ structure at from about 450 to about 525° C. while suspended over a $CdCl_2$ containing powder in an inert gas atmosphere for about 10 to 20 minutes; and a fourth step of coating the interdigitated back contact and $Cd(Se_xTe_{1-x})$ structure with a transparent passivation $Al_2O_3$ layer of from about 20 nm to about 100 nm thickness; and a fifth step of treating the resulting device structure to a $CdCl_2$ anneal at a temperature of between about 400 and about 450° C.

10. The method of claim 9 wherein the fifth step of treating the resulting device structure to a $CdCl_2$ anneal at a temperature of between about 400 and about 450° C. occurs in an atmosphere containing oxygen.

11. The method of claim 9 wherein the fifth step of treating the resulting device structure to a $CdCl_2$ anneal at a temperature of between about 400 and about 450° C. occurs in an atmosphere lacking oxygen.

12. The method of claim 9 wherein the second step of annealing the interdigitated back contact and $Cd(Se_xTe_{1-x})$ structure at 500-600° C. while suspended over a powder comprising $Cd(Se_xTe_{1-x})$ wherein x is from zero to 0.4 results in an increase in the density of the $Cd(Se_xTe_{1-x})$.

13. The method of claim 9 wherein the CdSeTe device further comprises a CdSeTe film.

14. The method of claim 13 wherein the CdSeTe device exhibits a minority carrier lifetime of at least 100 ns and a lateral diffusion length of at least 5 µm.

15. A method for making a polycrystalline CdSeTe device comprising an interdigitated back contact architecture wherein the method comprises a first step of a non-vacuum deposition of colloidal nanocrystalline $Cd(Se_xTe_{1-x})$ onto an interdigitated back contact structure.

16. The method of claim 15 wherein the interdigitated back contact structure is made by a method comprising a first step of depositing colloidal $Cd(Se_xTe_{1-x})$ nanocrystals through layer-by-layer spincoating on interdigitated back contact substrates; and a second step of drying $Cd(Se_xTe_{1-x})$ films at about 150° C.; and a third step of dipping the interdigitated back contact and $Cd(Se_xTe_{1-x})$ structure in a saturated solution of $CdCl_2$ in methanol and rinsing with isopropanol; and a fourth step of sintering nanocrystalline films through thermal annealing at about 350° C. for about 20 to about 30 seconds; and repeating the first step, the second step, the third step and the fourth step until the deposited layer is from about 1 µm to about 2 µm; and a final step of coating the interdigitated back contact and $Cd(Se_xTe_{1-x})$ structure with a transparent passivation $Al_2O_3$ layer of from about 20 nm to about 100 nm thickness.

17. The method of claim 16 wherein the first step of depositing colloidal $Cd(Se_xTe_{1-x})$ nanocrystals is through layer-by-layer bladecoating on interdigitated back contact substrates.

18. The method of claim 16 wherein the CdSeTe device further comprises a CdSeTe film and wherein the CdSeTe device exhibits a minority carrier lifetime of at least 100 ns and a lateral diffusion length of at least 5 µm.

\* \* \* \* \*